(12) United States Patent
Whipple et al.

(10) Patent No.: US 7,633,307 B2
(45) Date of Patent: Dec. 15, 2009

(54) METHOD FOR DETERMINING TEMPERATURE PROFILE IN SEMICONDUCTOR MANUFACTURING TEST

(75) Inventors: Paul J. Whipple, Austin, TX (US); Vincent V. Vu, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/303,234

(22) Filed: Dec. 16, 2005

(65) Prior Publication Data
US 2007/0139064 A1 Jun. 21, 2007

(51) Int. Cl.
*G01R 31/02* (2006.01)
(52) U.S. Cl. ..................................... 324/760
(58) Field of Classification Search ............... None
See application file for complete search history.

(56) References Cited

U.S. PATENT DOCUMENTS

| | | | | |
|---|---|---|---|---|
| 4,455,741 A | * | 6/1984 | Kolodner | 438/16 |
| 5,126,656 A | * | 6/1992 | Jones | 324/760 |
| 6,249,140 B1 | | 6/2001 | Shigihara | |
| 6,433,568 B1 | | 8/2002 | Whipple et al. | |
| 6,545,500 B1 | * | 4/2003 | Field | 324/770 |
| 6,574,763 B1 | * | 6/2003 | Bertin et al. | 324/760 |
| 6,632,278 B2 | * | 10/2003 | Falster et al. | 257/E21.321 |
| 6,682,945 B2 | * | 1/2004 | Richmond et al. | 438/14 |
| 6,747,245 B2 | * | 6/2004 | Talwar et al. | 219/121.8 |
| 6,801,049 B2 | * | 10/2004 | Ishida et al. | 324/765 |
| 6,828,815 B2 | * | 12/2004 | Ishida et al. | 324/765 |
| 6,853,953 B2 | * | 2/2005 | Brcka et al. | 702/182 |
| 6,971,791 B2 | * | 12/2005 | Borden et al. | 324/765 |
| 7,081,769 B2 | * | 7/2006 | Lee et al. | 324/765 |
| 7,313,501 B2 | * | 12/2007 | Nguyen | 702/136 |
| 7,445,383 B2 | * | 11/2008 | Huttenlocher et al. | 374/137 |
| 2002/0153916 A1 | * | 10/2002 | Lee et al. | 324/765 |
| 2003/0033116 A1 | * | 2/2003 | Brcka et al. | 324/511 |
| 2003/0165178 A1 | * | 9/2003 | Borden et al. | 374/5 |
| 2004/0089224 A1 | * | 5/2004 | Falster et al. | 117/13 |
| 2005/0170610 A1 | * | 8/2005 | Falster et al. | 438/455 |
| 2006/0173647 A1 | * | 8/2006 | Nguyen | 702/136 |

* cited by examiner

*Primary Examiner*—Jermele M Hollington
(74) *Attorney, Agent, or Firm*—John A. Fortkort; Fortkort & Houston P.C.

(57) ABSTRACT

A method is provided for testing semiconductor devices. In accordance with the method, a first usage temperature $T_1$ is obtained which represents the maximum or minimum temperature to which a semiconductor device will be exposed during its first use by a customer. The semiconductor device is then tested for defects while ramping the temperature to which the device is exposed from a first temperature $T_0$ to the temperature $T_1$.

22 Claims, 2 Drawing Sheets

METHOD FOR DETERMINING TEMPERATURE PROFILE IN SEMICONDUCTOR MANUFACTURING TEST

FIELD OF THE DISCLOSURE

The present disclosure relates generally to methods for testing semiconductor devices, and more particularly to methods for conducting thermal testing on semiconductor devices.

BACKGROUND OF THE DISCLOSURE

The cost to semiconductor manufacturers of replacing chip sets and other semiconductor devices after they have been incorporated into customer products is significantly larger than the cost of identifying defective devices at the fabrication level and removing them from the product stream. For example, once a defective semiconductor device is incorporated into a product, the product manufacturer must either scrap or rework the product (if the defect is detected at the manufacturing level), or initiate a product recall. In either case, a significant reduction in value of the product results. Consequently, semiconductor devices are typically subjected to rigorous testing at the fabrication level to identify and eliminate defective devices.

Traditional semiconductor manufacturing test methods typically involve subjecting a semiconductor device to thermal stress (termed a "burn in"), after which the device is tested for defects. The thermal stress typically takes the form of a thermal cycle defined by a maximum temperature ($T_{MAX}$) and a minimum temperature ($T_{MIN}$), though in some instances, the temperature of the testing chamber may simply be ramped to either a $T_{MAX}$ or $T_{MIN}$ value. Using such techniques, a small but significant percentage of defective devices remain undetected and fail during the first application usage. Such failures, termed in the art as Early Life Failures, represent a significant cost in the manufacture of semiconductor devices and the products which utilize them.

There is thus a need in the art for a method for testing semiconductor devices at the fabrication point which will successfully identify a larger percentage of defective devices, and which will reduce or eliminate the incidence of early life failures. There is also a need in the art for a fabrication process which incorporates such testing methods. These and other needs may be met by the devices and methodologies described herein.

DETAILED DESCRIPTION

Figure 1:
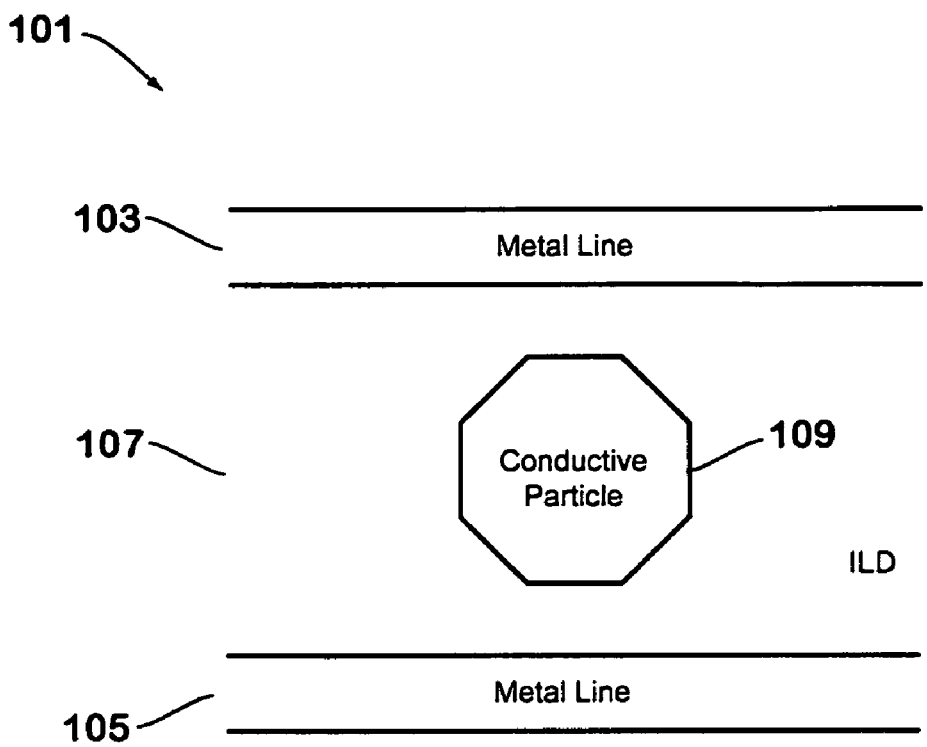
FIG. 1 is an illustration of a particle defect in a semiconductor device.

In one aspect, a method is provided herein for testing semiconductor devices. In accordance with the method, a first usage temperature profile $P_1$ is obtained which represents a typical temperature profile to which a semiconductor device will be exposed to during its first use, wherein $P_1$ includes the temperature curve $C_1$, wherein $C_1$ and $P_1$ start at temperature $T_1$, and wherein $C_1$ ends at temperature $T_2$. The semiconductor device is then tested for defects while exposing the device to a temperature profile $P_2$, wherein $P_2$ includes the curve $C_1$. In some embodiments, $P_1$ may equal $P_2$, $C_1$ may equal $P_1$, $0°$ C.$\leq T_1 \leq 35°$ C., $75°$ C.$\leq T_2 \leq 95°$ C., or $T_2 - T_1 \leq 50°$ C.

In another aspect, a method for testing a semiconductor device for defects is provided. In accordance with the method, a typical profile $P_1$ is obtained of a time dependent environmental parameter to which a semiconductor device will be exposed during its first use, wherein $P_1$ commences at time $t_0$ and ends at time $t_n$, and wherein the state $s_0$ of the parameter at time to differs from the state $s_k$ of the parameter at time $t_k$, wherein $t_0 < t_k \leq t_n$. The semiconductor device is then tested for defects while the environmental parameter is varied in accordance with the profile $P_2$, wherein $P_1$ and $P_2$ essentially overlap over the time interval $t_0 \leq t \leq t_k$.

In a further aspect, a method for testing a semiconductor device for defects is provided. In accordance with the method, a typical profile $P_1$ of an environmental parameter to which a semiconductor device may be exposed is determined. A test profile $P_2$ is then derived from the profile $P_1$, and the profile $P_2$ is used to test the semiconductor device for defects.

These and other aspects of the present disclosure are described in greater detail below.

It has now been found that the aforementioned needs may be met by testing semiconductor devices using a temperature profile that is derived from, is modeled after, or tracks at least a portion of, and preferably the entire, temperature profile to which a semiconductor device will be exposed to during its first usage.

Without wishing to be bound by theory, it is believed that many of the methods utilized in the art to test semiconductor devices are flawed in that they test for defects only after the device has been preheated. In particular, in such methods, although a temperature ramp or temperature cycle may be utilized during testing, the actual testing does not typically commence until after the device has been preheated to a starting temperature. Unfortunately, many defects that lead to early life failure manifest themselves mostly during the initial heat-up or temperature ramp, when significant temperature differentials exist between the components of the semiconductor device (e.g., between the interlayer dielectric (ILD) and the metal lines). Hence, such defects are frequently missed by the testing conducted by semiconductor manufacturers.

It has also been found that, by testing a semiconductor device using a temperature profile that tracks, is derived from, or is modeled after at least a portion of the temperature profile to which the semiconductor device will be exposed during its first usage (and that preferably tracks, is derived from, or is modeled after at least the initial temperature ramp of this temperature profile), there is a greater likelihood that the temperature differentials experienced by the device during its first usage will be replicated during testing. Consequently, device defects of the type noted above are much more likely to manifest themselves during product testing, thereby significantly reducing or eliminating the incidence of early life failure.

The methodologies described herein may be further understood with reference to FIG. 1, which depicts one particular, non-limiting example of a possible defect that can arise in a semiconductor device. The device 101 of FIG. 1 comprises first 103 and second 105 adjacent metal lines that are separated by an interlayer dielectric (ILD) 107. The device contains a particle defect 109 (that is, a defect arising from the presence in the device of particulate debris left over from the manufacturing process) between the first 103 and second 105 adjacent metal lines of the device. If the particle defect 109 is conductive (e.g., if the particle giving rise to it comprises electrically conductive materials such as copper or steel), the defect 109 has the potential to modify the electrical characteristics of the circuitry of the semiconductor device 101.

Figure 2:
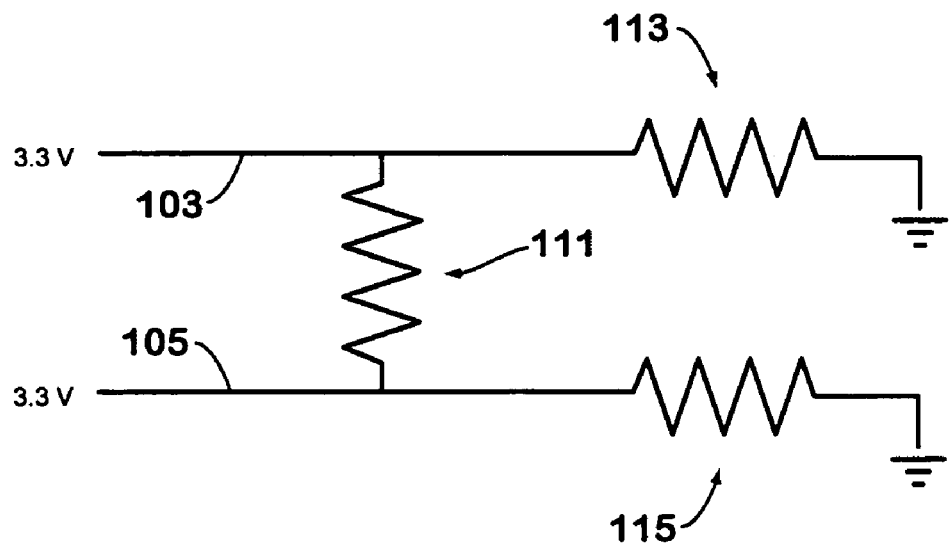
FIG. 2 is an electrical diagram of the particle defect of FIG. 1.

In the event that this modification is significant and occurs under a wide range of operating conditions, there is a good chance that it will be detected by conventional test methodologies. In some cases, however, the defect 109 may manifest itself only under a narrower range of conditions. For example, as shown in FIG. 2, the particle defect 109 may effectively create an alternate circuit 111 between the adjacent metal lines 103, 105. The alternate circuit 111 may be characterized, for example, by a condition dependent resistance which permits significant current flow between the adjacent metal lines 103, 105 (and associated short-circuiting of the device) only when a significant temperature differential exists between the ILD 107 and the adjacent metal lines 103, 105. This may be due, for example, to differences in the coefficients of thermal expansion of the ILD 107 and the adjacent metal lines 103, 105. Consequently, the defect may remain undetected by conventional test methodologies, but may manifest itself during the initial temperature ramp typically encountered during first use of the device, thus leading to early life failure.

Figure 3:
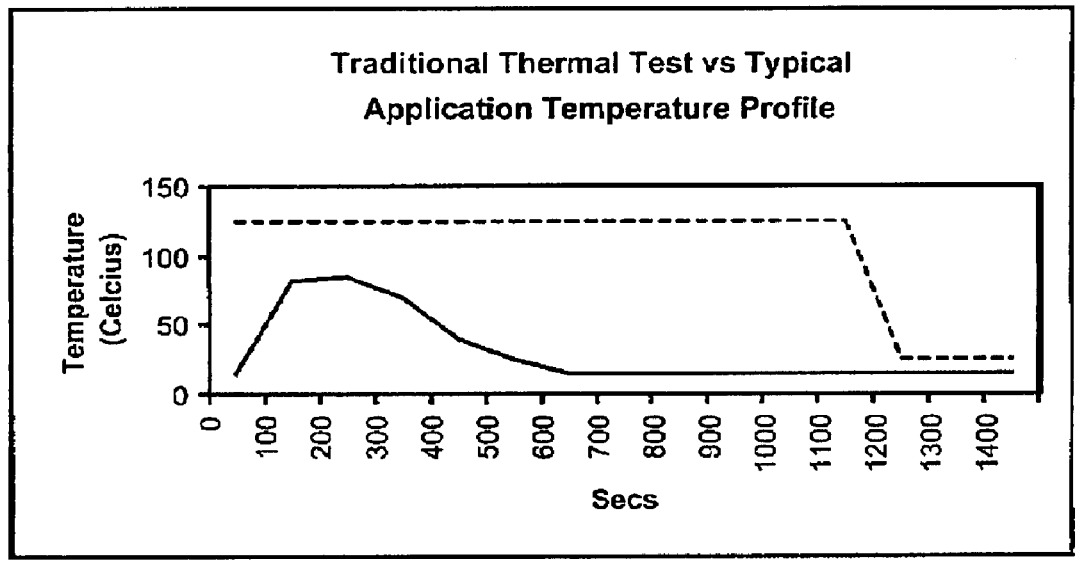
FIG. 3 is a graph comparing a conventional thermal test (dashed line) to a typical temperature profile (solid line) that the device is subjected to in first use.

FIG. 3 illustrates the temperature profile for a conventional thermal test, and compares it to the actual temperature profile experienced by a semiconductor device in a typical first usage. The semiconductor device in this particular case is a chip set for an automobile engine. As seen therein, in a typical first usage, the device experiences an initial temperature ramp that extends from room temperature (25° C.) to about 85° C. The temperature of the device then levels off, before gradually dropping to a temperature that approaches ambient temperatures.

By contrast, since testing does not commence until the device has been preheated, the test temperature profile illustrated in FIG. 3 is essentially linear at about 125° C. over the first 1200 seconds of the test, after which it drops to about 35° C. for the final 200 seconds of the test. Since the test does not commence until the chip set has been heated to 125° C., it does not consider device performance over the initial temperature ramp when the temperature differentials between the components of the device are at a maximum. Consequently, the test has the potential to miss particle defects of the type illustrated in FIGS. 1-2.

Figure 4:
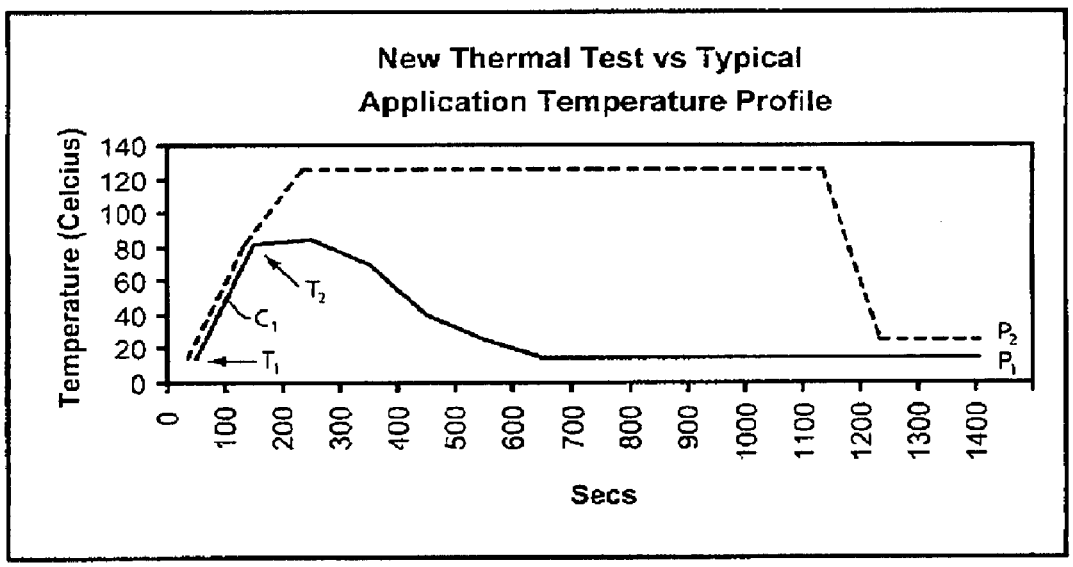
FIG. 4 is a graph comparing a thermal test in accordance with the teachings herein (dashed line) to a typical temperature profile (solid line) that the device is subjected to in first use (note that the thermal test line has been horizontally shifted slightly to avoid overlap and preserve clarity).

FIG. 4 illustrates a method of the type described herein which is being used in conjunction with the same typical first usage temperature profile illustrated in FIG. 3. Unlike the conventional test approach illustrated in FIG. 3, in the method depicted in FIG. 4, testing is conducted over the initial temperature ramp of the typical first usage temperature profile. Hence, this approach has a greater likelihood of detecting defects of the type that frequently lead to early life failure (such as, for example, defects that manifest themselves only when temperature differentials exist between components of the device) and that might be missed in the approach illustrated in FIG. 3. The remainder of the temperature profile in this particular embodiment is similar to the temperature profile utilized in the conventional test shown in FIG. 3, and features a higher temperature burn-in designed to ensure device durability by testing the device at higher temperatures (and associated thermal stress levels) than the device is likely to experience during normal usage.

One skilled in the art will appreciate that various modifications are possible to the methodology depicted in FIG. 4. For example, rather than tracking, being modeled after, or being derived from only the initial temperature ramp, the test could track, be modeled after, or be derived from the entire typical temperature profile experienced by the device or the data giving rise to it. In some embodiments, this may involve closely replicating a typical first usage temperature profile during testing, while in other embodiments, deviations from the typical first usage temperature profile may occur. For example, the test temperature profile may exceed the typical first usage temperature profile by an amount that may be fixed or that may vary over the temperature profile. By way of illustration, the test profile illustrated in FIG. 4 essentially replicates the typical first usage temperature profile over the initial temperature ramp, and then exceeds the typical first usage temperature profile over the remainder of the test.

It will further be appreciated that the typical temperature profile experienced by a device may vary significantly from one type of device to another, and may also vary significantly depending on the product that the device will be incorporated into, the use to which the product may be put, or the environment the product is likely to be utilized in. Various statistical methodologies as are known to the art may be utilized to establish a typical first usage temperature profile for a particular semiconductor device. These methodologies may be used in conjunction with data derived from the contemplated use of the device being tested. Such data may be provided, for example, by end users of the device, or by manufacturers that incorporate the device being tested into other products. Thus, for example, if the product being tested is an automotive chipset, such data, and/or the typical first usage profile derived from the data, may be provided to the chipset manufacturer from an automobile manufacturer or trade group. A test profile may then be derived from, or modeled after, the typical first usage profile or the data giving rise to it.

In the case of chipsets for automobile engines, the typical first usage temperature profile $P_1$ frequently commences with a temperature ramp characterized by a starting temperature $T_1$ and a terminal temperature $T_2$. The starting temperature $T_1$ is typically within the range of about 0° C. to about 50° C., more typically within the range of about 15° C. to about 35° C., and most typically within the range of about 20° C. to about 30° C. The terminal temperature $T_2$ is typically within the range of about 60° C. to about 110° C., more typically within the range of about 75° C. to about 95° C., and most typically within the range of about 80° C. to about 90° C. The difference between the starting temperature $T_1$ and the terminal temperature $T_2$ is typically at least about 25° C., and more typically at least about 50° C. Moreover, if $T_{P1max}$ is the maximum temperature in the temperature profile $P_1$ and $T_{P2max}$ is the maximum temperature in the test temperature profile $P_2$, it is preferably the case that $T_{P2max} > T_{P1max}$. In addition, if $t_0$ is the starting time of the temperature ramp and $t_k$ is the time at which the ramp essentially terminates, it is typically the case that $t_k - t_0$ is at least about 100 seconds, and that $t_k - t_0$ is less than about 150 seconds.

Moreover, while the particular embodiment of the methodology depicted herein deals specifically with temperature profiles, and while the discussion above frequently assumes that temperature is the time dependent environmental parameter being tested, one skilled in the art will appreciate that the principles described herein could also be applied to tests that consider other time dependent environmental parameters in a first usage profile, such as, for example, pressure, percent humidity, stress, and the like. In these tests as well, the ability of the methodologies disclosed herein to consider the effect of such parameters on device performance during the initial period of first use when those parameters are changing the most (and when the device has not yet reached a steady state with respect to those parameters) permits those methodologies to detect device defects that may not manifest themselves under conventional test methodologies.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A method for testing a semiconductor device for defects, comprising:
   obtaining a first usage temperature profile $P_1$ which represents a typical temperature profile to which a semiconductor device will be exposed to during its first use, wherein $P_1$ includes the temperature curve $C_1$, wherein $C_1$ starts at temperature $T_1$ and ends at temperature $T_2$; and
   testing the semiconductor device for defects while exposing the device to a temperature profile $P_2$, wherein $P_2$ includes the curve $C_1$, wherein $T_1 \neq T_2$, and wherein the device is tested over the entire temperature profile $P_2$, including over the entire curve $C_1$.

2. The method of claim 1, wherein $P_1 = P_2$.
3. The method of claim 1, wherein $C_1 = P_1$.
4. The method of claim 1, wherein $0° C. \leq T_1 \leq 35° C$.
5. The method of claim 1, wherein $75° C. \leq T_2 \leq 95° C$.
6. The method of claim 1, wherein $T_2 - T_1 \geq 50° C$.
7. The method of claim 1, wherein the semiconductor device is continuously tested for defects while it is exposed to the temperature profile $P_2$.
8. The method of claim 1, wherein temperature profile $P_2$ includes first, second and third segments, wherein said first segment staffs at temperature $T_1$ and ends at temperature $T_2$, wherein said second segment staffs at temperature $T_2$ and ends at temperature $T_2$, wherein said third segment starts at temperature $T_2$ and ends at temperature $T_3$, wherein $T_2 > T_1$ and $T_2 > T_3$.
9. The method of claim 1, wherein $T_{P1max}$ is the maximum temperature in the temperature profile $P_1$, wherein $T_{P2max}$ is the maximum temperature in the temperature profile $P_2$, and wherein $T_{P2max} > T_{P1max}$.
10. The method of claim 1, wherein the semiconductor device is a chipset for an automobile engine.
11. The method of claim 1, wherein the first usage occurs after the device is incorporated into a product.
12. The method of claim 1, further comprising subjecting the semiconductor device to a first use after testing.

13. A method for testing a semiconductor device for defects, comprising:
   obtaining a typical profile $P_1$ of a time dependent environmental parameter to which a semiconductor device will be exposed during its first use, wherein $P_1$ commences at time $t_0$ and ends at time $t_n$, and wherein the state $s_0$ of the parameter at time $t_0$ differs from the state $S_k$ of the parameter at time $t_k$, wherein $t_0 < t_k \leq t_n$; and
   testing the semiconductor device for defects while the environmental parameter is varied in accordance with the profile $P_2$, wherein $P_1$ and $P_2$ essentially overlap over the time interval $t_0 \leq t \leq t_k$, and wherein the semiconductor device is tested over the time interval $t_0 \leq t \leq t_k$.

14. The method of claim 13, wherein the time dependent environmental parameter is temperature.

15. A method for testing a semiconductor device for defects, comprising:
   determining a typical profile $P_1$ of an environmental parameter to which a semiconductor device may be exposed;
   deriving a test profile $P_2$ from the profile $P_1$; and
   using the profile $P_2$ to test the semiconductor device for defects;
   wherein $P_1$ includes a curve $C_1$, wherein $C_1$ starts at temperature $T_1$ and ends at temperature $T_2$, wherein $T_1 \neq T_2$, and wherein the semiconductor device is tested for defects over the entire curve $C_1$.

16. The method of claim 15, wherein the profile $P_1$ is a typical profile of a time dependent environmental parameter to which a semiconductor device may be exposed during its first use.

17. The method of claim 15, wherein $P_1$ commences at time $t_0$ and ends at time $t_n$, wherein the state $s_0$ of the parameter at time to differs from the state $S_k$ of the parameter at time $t_k$, and wherein $t_0 < t_k \leq t_n$.

18. The method of claim 15, wherein the semiconductor device is tested for defects while the environmental parameter is varied in accordance with the profile $P_2$, and wherein $P_1$ and $P_2$ essentially overlap over the time interval $t_0 \leq t \leq t_k$.

19. The method of claim 15, wherein the environmental parameter is a time dependent variable.

20. The method of claim 15, wherein the profile $P_2$ is derived from data related to the contemplated end use of the semiconductor device.

21. The method of claim 15 wherein the environmental parameter is temperature.

22. The method of claim 15, wherein the step of determining a typical profile $P_1$ of an environmental parameter to which a semiconductor device will be exposed includes the steps of obtaining data related to an end use of the semiconductor device, and utilizing that data to derive the profile $P_1$.

* * * * *